United States Patent
Sakai

(10) Patent No.: US 7,231,960 B2
(45) Date of Patent: Jun. 19, 2007

(54) COOLER FOR COOLING BOTH SIDES OF SEMICONDUCTOR DEVICE

(75) Inventor: Yasuyuki Sakai, Oobu (JP)

(73) Assignee: Denso Corporation, Kariya (JP)

( * ) Notice: Subject to any disclaimer, the term of this patent is extended or adjusted under 35 U.S.C. 154(b) by 327 days.

(21) Appl. No.: 10/733,472

(22) Filed: Dec. 12, 2003

(65) Prior Publication Data

US 2005/0051298 A1     Mar. 10, 2005

(30) Foreign Application Priority Data

Dec. 16, 2002 (JP) .............................. 2002-364337
Nov. 14, 2003 (JP) .............................. 2003-385761

(51) Int. Cl.
*F28F 9/013* (2006.01)

(52) U.S. Cl. .................... 165/76; 165/80.4; 165/83; 361/699

(58) Field of Classification Search ............... 165/80.4, 165/81–83; 361/716
See application file for complete search history.

(56) References Cited

U.S. PATENT DOCUMENTS 3,921,201 A * 11/1975 Eisele et al. ................. 257/714
4,420,739 A * 12/1983 Herren ......................... 338/53
4,443,921 A *  4/1984 Allemandou ............. 29/890.46
4,570,700 A *  2/1986 Ohara et al. ............. 165/134.1
4,578,745 A *  3/1986 Olsson ......................... 363/68
2001/0033477 A1* 10/2001 Inoue et al. ................. 361/718

FOREIGN PATENT DOCUMENTS

| JP | A 6-291223 | 10/1994 |
| JP | A 2001-320005 | 11/2001 |
| JP | A-2002-343916 | 11/2002 |

* cited by examiner

*Primary Examiner*—Allen J. Flanigan
(74) *Attorney, Agent, or Firm*—Oliff & Berridge PLC

(57) ABSTRACT

An object of the present invention is to provide a cooler for cooling both sides (top and bottom surfaces) of a semiconductor device, wherein the variation of pressing force on flat cooling tubes holding a semiconductor device is reduced, thereby uniformly dissipating the heat generated by the semiconductor device. When the holding plates press the flat cooling tubes and semiconductor modules by tightening the nut, the dimensional tolerances in the stacking direction are absorbed by the deformable portions in the inlet and outlet headers. A spacer may be employed inside the flat cooling tubes in order to suppress the deformation of the flat cooling tubes along the stacking direction.

3 Claims, 11 Drawing Sheets

COOLER FOR COOLING BOTH SIDES OF SEMICONDUCTOR DEVICE

BACKGROUND OF THE INVENTION

1. Field of the Invention

The present invention relates to a cooler for cooling both sides (top and bottom surfaces) of a semiconductor device.

2. Description of the Related Art

There is disclosed in JP2001-320005A one of the conventional coolers for cooling both sides of a semiconductor device, which comprises: a plurality of flat cooling tubes each of which has heat-absorbing surfaces for contacting the surfaces of semiconductor modules and one or more channels for passing a coolant and is disposed alternately with the semiconductor module; an inlet header which is connected with one ends of the flat cooling tubes and supplies the flat cooling tube with the coolant; an outlet header which is connected with the other ends of the flat cooling tubes and collects the coolant from the flat cooling tubes; and a pressing mechanism (e.g., bolt and nut) for pressing the flat cooling tubes which hold the semiconductor devices from both sides of the semiconductor device.

Further, there is disclosed in JP6-291223A, 1994, one of conventional heat sinks for dissipating heat from both sides of a semiconductor device.

However, the cooler as disclosed in JP2001-320005A has a disadvantage that the temperature of the semiconductor may vary widely, even when the heat generated by the semiconductor devices is even.

The inventor made clear through research that the temperature variation is caused by a variation of the pressing force on the semiconductor device and the flat cooling tube, because thermal resistance depends upon the pressing force.

The flat cooling tubes are deformed in the direction perpendicular to the semiconductor surface most greatly at the center portion where the bolt and nut press them, while they are deformed least at both ends (inlet and outlet of the coolant), because they are fixed to the headers. As a result, the pressing force varies depending upon the contact positions in the longitudinal direction of the flat cooling tube. Further, the deformation varies due to a dimensional variation such as a variation of affixing positions of the flat cooling tubes to the headers and variation of thickness of the flat cooling tubes. As a result, the pressing force becomes varied. Concretely, some part of the fastening force of the bolt is absorbed for an elastic deformation of one of the flat cooling tubes and the rest becomes the pressing force between the semiconductor device and the flat cooling tube. Hence the variation of the reaction force caused by the elastic deformation results in the above-mentioned pressing force variation.

SUMMARY OF THE INVENTION

An object of the present invention is to provide a cooler using a coolant for cooling both sides (top and bottom surfaces) of a semiconductor device, wherein the variation of pressing force on flat cooling tubes holding a semiconductor device is reduced, thereby uniformly dissipating the heat generated by the semiconductor device (i.e. semiconductor chip or module) and moreover reducing the variation of heat dissipation capability depending upon the position of semiconductor device. The above-mentioned uniform heat dissipation capability is achieved by a simple structure.

The present invention has nine features stated below.

A cooler of the present invention of Feature 1 comprises: a plurality of flat cooling tubes which have one or more cooling channels to allow a coolant to flow through, contact top and bottom surfaces of the semiconductor device and are disposed at both sides of the semiconductor devices; an inlet header which supplies the coolant to the opening ends of the cooling tubes; an outlet header which collects the coolant from the other opening ends of the cooling tubes; and a pressing mechanism for pressing a stack of the semiconductor devices and cooling tubes. Feature 1 is characterized in that the header is deformed by the pressing force of the pressing mechanism, thereby absorbing a dimensional tolerance, in the stacking direction, between the total length of the pressed stack and the total length of the header portion.

According to Feature 1, the header is formed so as to deform more easily than the flat cooling tube portion in the stacking direction. Thus, the header has an expanding/compressing function. Therefore, under the abovementioned pressing force, the force applied to a semiconductor device from a cooling tube is prevented from being excessively great to damage the semiconductor device, and deformation of the headers absorbs the difference between the total thickness of the stack, especially of the portion where the semiconductor devices and the cooling tubes come in contact, and the length of the headers in the stacking direction, thereby transferring the heat efficiently from the semiconductor devices to the cooling tubes. Further, the variation of the pressing force due to dimensional variation of each component and variation of the pressing force on each portion of the flat cooling tubes are reduced, thereby uniformly dissipating the heat generated by the semiconductor device (i.e. semiconductor chip or module) and moreover reducing the variation of heat dissipation capability depending upon the position of semiconductor device. The above-mentioned uniform heat dissipation capability is achieved by a simple structure. In other words, because the tolerance of each component is absorbed by the deformation of the header itself, the pressing force on the semiconductor device can be made uniform. Further, because the dimensional variation of each component is absorbed by the easy deformation of the header in the direction of the pressing force, the rigidity of the portion of the flat cooling tube contacting the semiconductor device can be assured and the pressing force on each part of the semiconductor device can be made uniform.

In Feature 2, the flat cooling tubes come in close contact with the semiconductor devices under the pressing force.

According to Feature 2, the headers are made deformable more easily than the flat cooling tubes in the stacking direction. Therefore, even when the thickness difference exists between the header and the middle portions of the stack, the flat cooling tube can keep close contact with the semiconductor device, thereby transferring the heat from the semiconductor device efficiently. Here, in Features 1 and 2, it is desirable to keep the deformation of the headers within the limit of elasticity, but it may also include plastic deformation.

In Feature 3, the inlet and outlet headers consist of end portions of the cooling tubes and connecting members. The end portions of the cooling tubes is connected to the cooling channels of the cooling tube and have two head holes on both sides opening to the stacking direction. The connecting members are placed between two adjacent end portions. Here, the connecting member includes a compressible portion which compresses in the stacking direction under the pressing force.

According to Feature 3, a connecting member consisting of a part of the header is held between the two adjacent flat cooling tubes in the stacking direction, while the both end portions of the flat cooling tubes construct the rest of the header. Thus, the connecting member is formed independently from the flat cooling tube. Further, the connecting member can be of complex shape easily deformable in the stacking direction. Accordingly, the flexible connecting member can be manufactured by a simple process.

In Feature 4, the connecting member is of a bellows shape. The bellows has large cylindrical portions and small cylindrical portions, connected alternately in the axial direction. The large cylindrical portions are preferably of one diameter, but not necessarily so. The small cylindrical portions are preferably of one diameter, but not necessarily so. Further, the bellows may be of a spiral shape.

According to Feature 4, both the flat cooling tube and the connecting member can be manufactured by simple processes. Thus, complicated manufacturing processes are avoided and the compressible portion of the connecting member is provided with excellent flexibility.

In Feature 5, the inlet header as well as the outlet header comprises: an opening portion in each flat cooling tube which is opened along the stacking direction and is connected in a liquid tight manner with an adjacent flat cooling tube; a diaphragm which is formed around the opening portion and is deformable under the pressing force along the stacking direction, wherein an end of the opening portion is connected in a liquid tight manner with another end of another opening portion of an adjacent flat cooling tube.

According to Feature 5, because both ends of the flat cooling tube which comprise headers have compressible portions in the stacking direction, the variation between the total thickness in the stacking direction of the header is absorbed, without employing the above-mentioned connecting member and moreover without excessive pressing force. Accordingly, an excellent dissipation capability can be obtained, due to the close contact of the flat cooling tube with the semiconductor device. Thus, the header having compressible portions of excellent flexibility employing a simple structure can be manufactured by a simple process. Here, the diaphragm may be a plurality of coaxial rings. However, any known structure which can deform along the stacking direction may be employed.

In Feature 6, the flat cooling tube is made of two press-formed metal plates including a cup-shaped portion brazed face to face to form a tube.

According to Feature 6, the flat cooling tube can be manufactured by a simple process.

In Feature 7, the flat cooling tube is made of two press-formed metal plates of the same shape which are brazed face to face to form a tube.

According to Feature 7, the flat cooling tube can be manufactured by another simple process.

In Feature 8, the flat cooling tube comprises a spacer member inside its hollow for supporting the pressing force and suppressing deformation of the flat cooling tube along the stacking direction. The spacer may be brazed with the inner surface of the flat cooling tube, may be fitted into the flat cooling tube, or may be simply in contact with the inner surface of the flat cooling tube.

According to Feature 8, the deformation of a part of the flat cooling tube which contacts the semiconductor device can be suppressed. Thus, the pressing force between the flat cooling tube and semiconductor device can be made uniform by a simple structure.

In Feature 9, the pressing mechanism comprises: a pair of holding plates contacting the outermost sides of the stack; through bolts which pass through the holding plates; and nuts fastened to the through bolts.

According to Feature 9, the pressing force between the flat cooling tube and semiconductor device can be made uniform by a simple structure.

PREFERRED EMBODIMENT OF THE INVENTION

Figure 1:
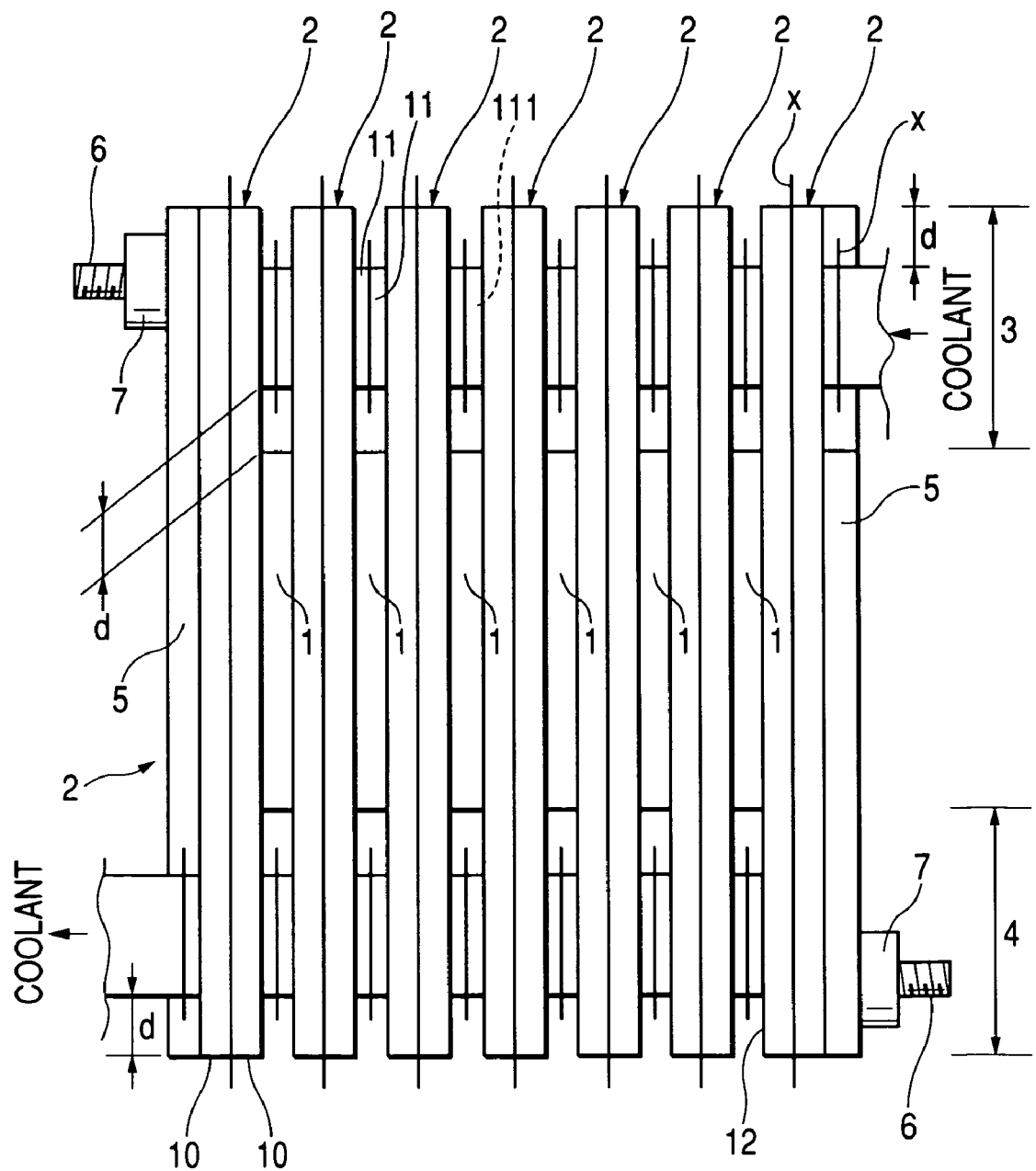
FIG. 1 is an elevational view of a cooler for cooling a plurality of semiconductor modules of Embodiment 1 of the present invention.

Preferred embodiments of the present invention are explained, referring to the drawings.

Embodiment 1

FIG. 1 is an elevational view of a cooler for cooling a plurality of semiconductor devices of the present invention which comprises: six semiconductor modules 1; seven flat cooling tubes 2; an inlet header 3; an outlet header 4; two holding plates 5; two through bolts 6; and two nuts 7. Here, holding plates 5, bolts 6 and nuts 7 construct a pressing mechanism.

The six semiconductor modules 1 constitute arms of a three-phase inverter. The semiconductor module 1 comprises: a semiconductor chip, i.e. a transistor in this embodiment; and a pair of main electrode plates attached to each surface of the semiconductor chip. The semiconductor chip and the main electrode plates are molded in resin in a flat shape, with signal terminals and control electrode terminals extending therefrom. Concretely, a part of the main electrode plate on the top surface of the semiconductor chip is recessed in order to expose conductive pads for a control electrode as well as communication electrodes, which are connected to a wire not shown here extending to the far side of the drawing. The main electrode plates are usually made of copper or aluminum and are connected to each side of the semiconductor chip by solder or bump. Since the structure of the semiconductor module 1 is known well, it is not shown here in detail. In place of the above-mentioned semiconductor module 1, a bare semiconductor chip may be employed in such a manner that the control electrode and the communication electrodes are electrically insulated from the flat cooling tubes by, for example, partly indenting the flat cooling tubes.

The flat cooling tubes 2 and the semiconductor modules 1 are alternately disposed between each other in such a manner that the main electrodes except those to be grounded are electrically insulated from the flat cooling tubes 2 by, for example, insulating films, or in such a manner that, for an insulated type three-phase inverter, all the main electrodes are insulated from the flat cooling tubes 2.

Each of the cooling tubes 2 is shaped as a hollow flat plate, of which one end is connected with adjacent cooling tubes, thereby constructing an inlet header 3, while its another end is connected with each other, thereby constructing an outlet header 4.

The flat cooling tube 2 is manufactured in such a manner that two press-formed metal plates 10 of the same cup shape are brazed face to face to form a tube. The brazing portion is denoted by "x" in FIG. 1. Accordingly, the coolant flows through the hollow in the flat cooling tube 2 in the direction perpendicular to the stacking direction.

There is a connecting pipe portion 11 protruding from each halves of flat cooling tube.

The connecting pipe portion 11 has an opening 111 inside itself. The protrusion height of the connecting pipe portion 11 for each halves of flat cooling tube is equal to a half of the thickness of the semiconductor module 1. It is important to assure a distance "d" between both ends of the flat cooling tube 2 and connecting pipe portion 11 as well as between the connecting pipe portion 11 and semiconductor module 1. The press-formed metal plates 10 (forming a flat cooling tube 2) have a ring plate portion 12 (of which ring width is equal to or greater than "d") around the connecting pipe portion 11. The ring plate 12 works as a diaphragm deforming along the stacking direction of the flat cooling tubes 2 and semiconductor modules 1.

Figure 2:
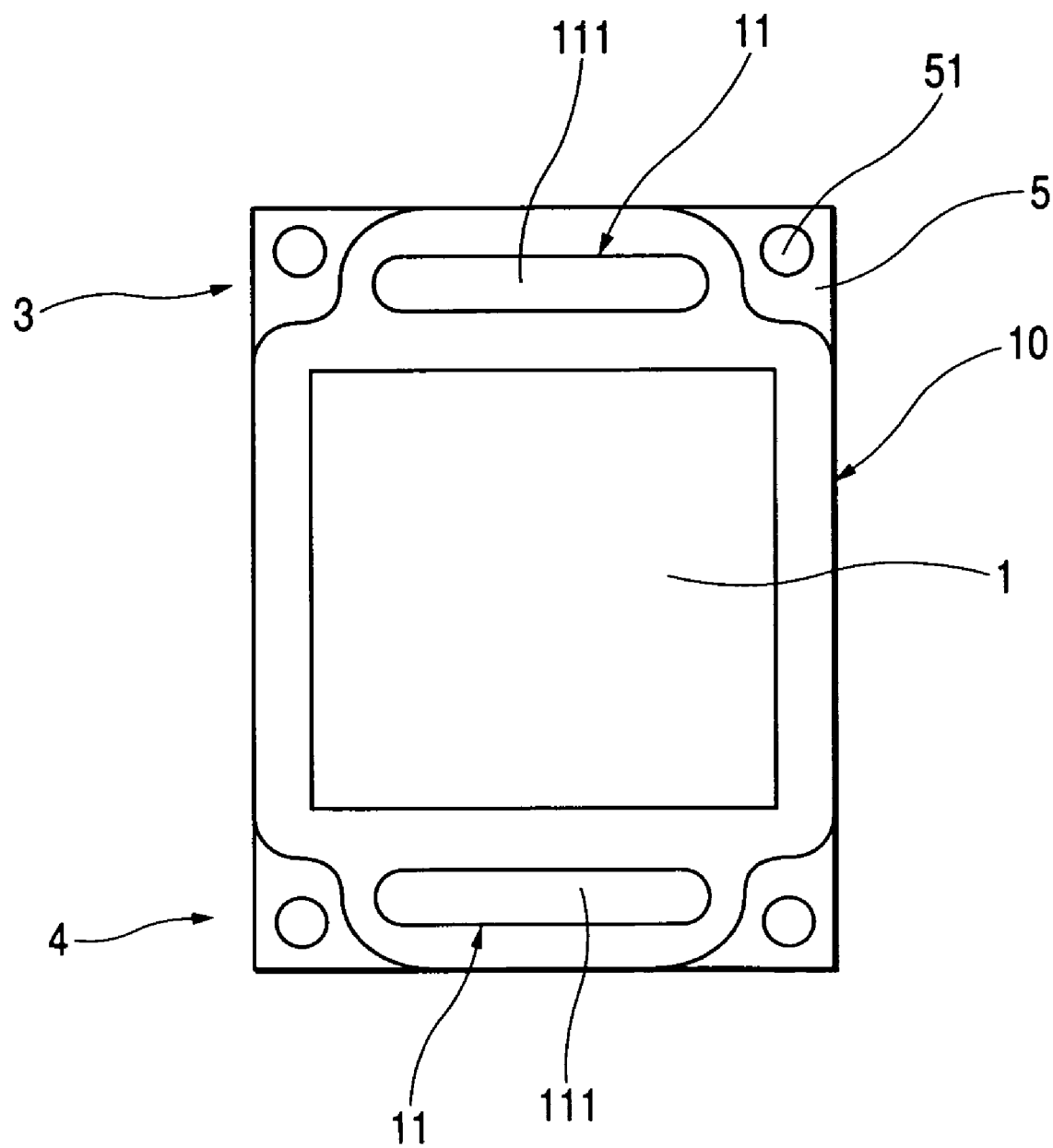
FIG. 2 is a side view of a press-formed metal plate (flat cooling tube) together with a semiconductor module.

FIG. 2 is a side view of the press-formed metal plate 10 together with the semiconductor module 1, seen from the stacking direction of the flat cooling tubes 2 and semiconductor modules 1. Through holes 51 in the holding plate 5 are positioned near both ends of the connecting tube portions 11, in order to pass through the through bolts 6. The through holes 51 may be positioned near the semiconductor module 1.

Figure 3:
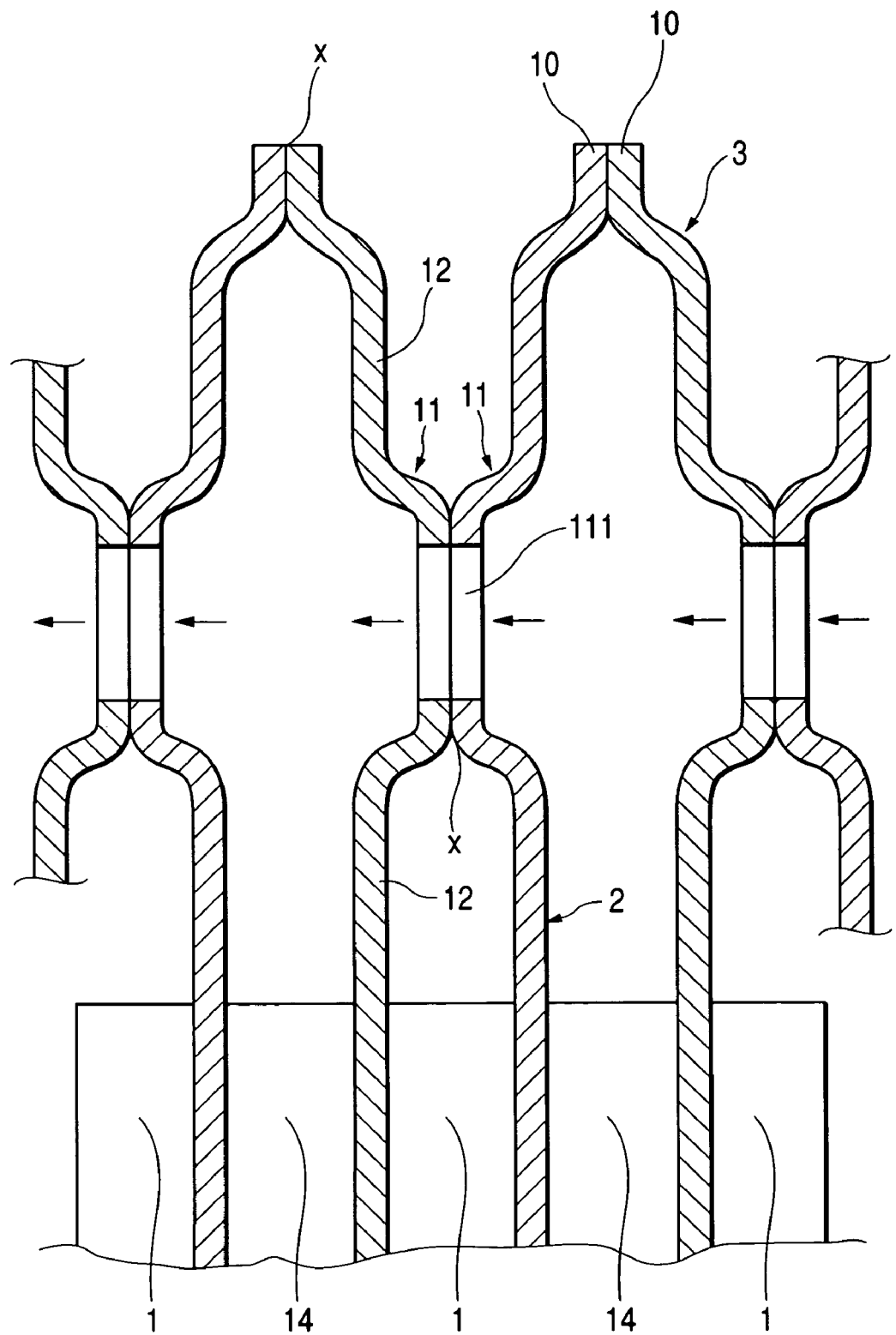
FIG. 3 is an enlarged cross sectional view near opening portions opened along the stacking direction of the flat cooling tubes and semiconductor modules.

FIG. 3 is an enlarged cross sectional view near the connecting pipe portion 11. When the holding plates 5 press the flat cooling tubes 2 (pairs of press formed metal plates 10) and semiconductor modules 1, by tightening the nut 7, the dimensional tolerances along the stacking direction are absorbed by the diaphragm deformation in the inlet and outlet headers 3 and 4. Spacer 14 is held between the flat cooling tubes 2 in order to support the pressing force against the semiconductor devices 1 along the stacking direction. The spacers 14 extend toward the connecting tube portions 11 by a distance equal to or greater than the semiconductor modules 1.

Figure 4:
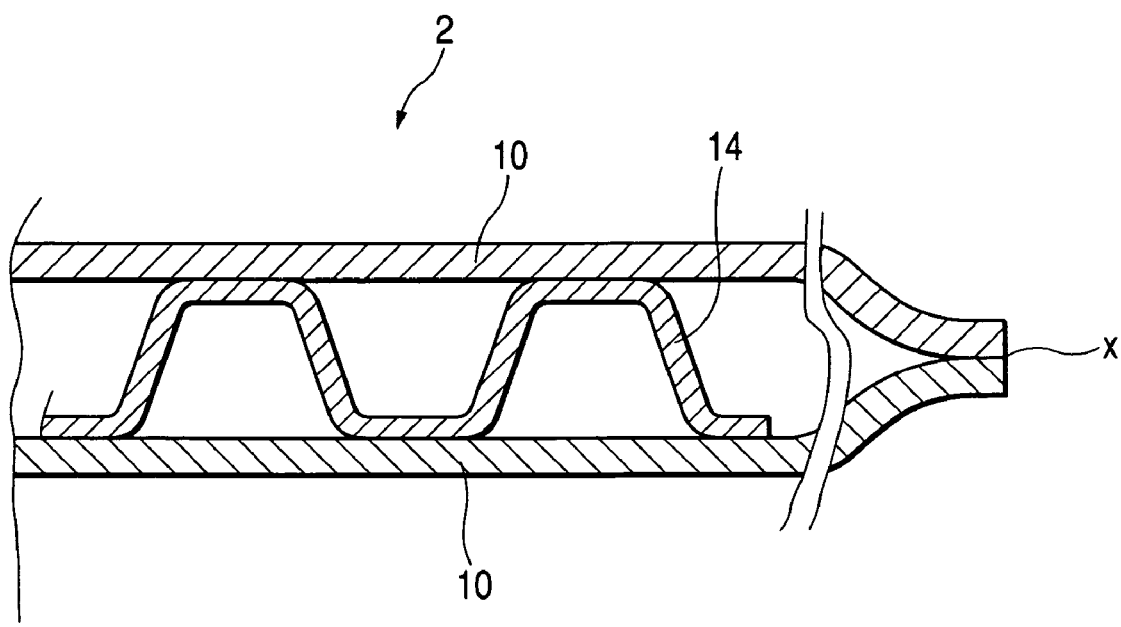
FIG. 4 is a cross sectional view of a spacer in a hollow for passing coolant.

FIG. 4 is a cross sectional view of the spacer 14 which is a corrugated metal plate, thereby forming flowing paths for coolant. Employing the spacer 14, deformation of the flat cooling tube 2 at the area of contact with the semiconductor device 1 is suppressed when the pressing force is applied by the bolt and nut. As a result, almost all the pressing force generated by the pressing mechanism is applied to the central portion of the flat cooling tube 2 adjacent to the semiconductor device 1.

On the other hand, since the diaphragm (ring plate 12) of the inlet and outlet headers 3 and 4 are easily deformed along the stacking direction, the difference between the total length of the headers 3 or 4 and that of the central portion of the stack can be absorbed without difficulty.

Embodiment 1 can be achieved by simple press-forming and brazing of metal plates. The pressing force can be made uniform for all the semiconductor modules 1 in the stack.

Figure 5:
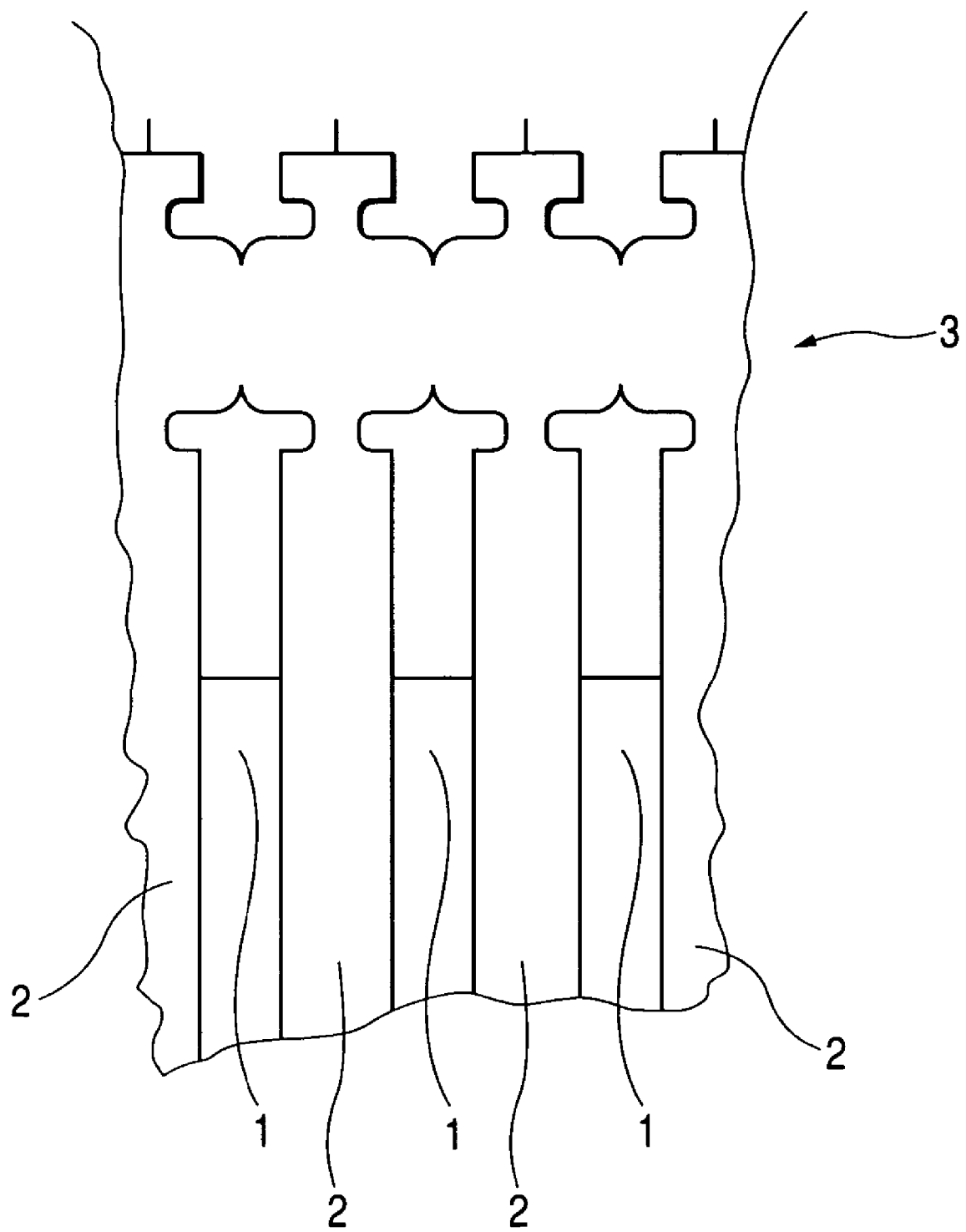
FIG. 5 is a cross sectional view of a variant of flat cooling tubes around an inlet header.

FIG. 5 is a cross sectional view of a variant of the flat cooling tube 2 of Embodiment 1 around the inlet header 3. Deep corrugation is press-formed on the metal plates of the inlet header 3 to form diaphragms, thereby being easily deformable in the stacking direction.

Figure 6:
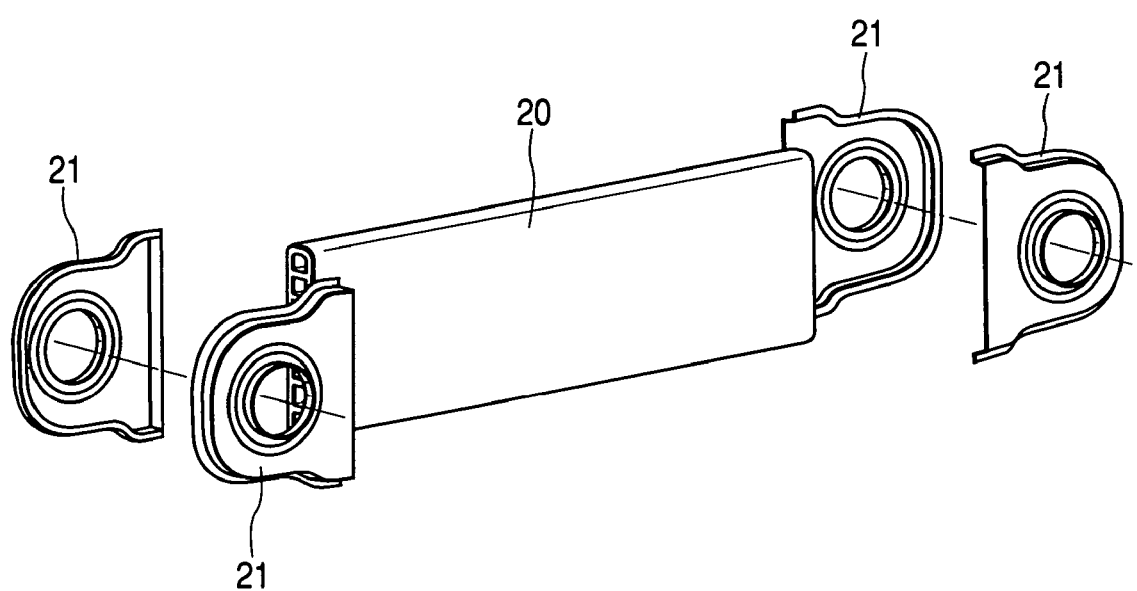
FIG. 6 is a perspective view of another variant of flat cooling tube.

FIG. 6 is a perspective view of another variant of the flat cooling tube 2 of Embodiment 1, wherein a plurality of holes are formed in an extruded metal plate 20, and diaphragms 21 for the inlet and outlet headers 3 and 4 are brazed at both ends of the metal plate 20. The spacer 14 is not required because the metal plate 20 has high stiffness.

Figure 7:
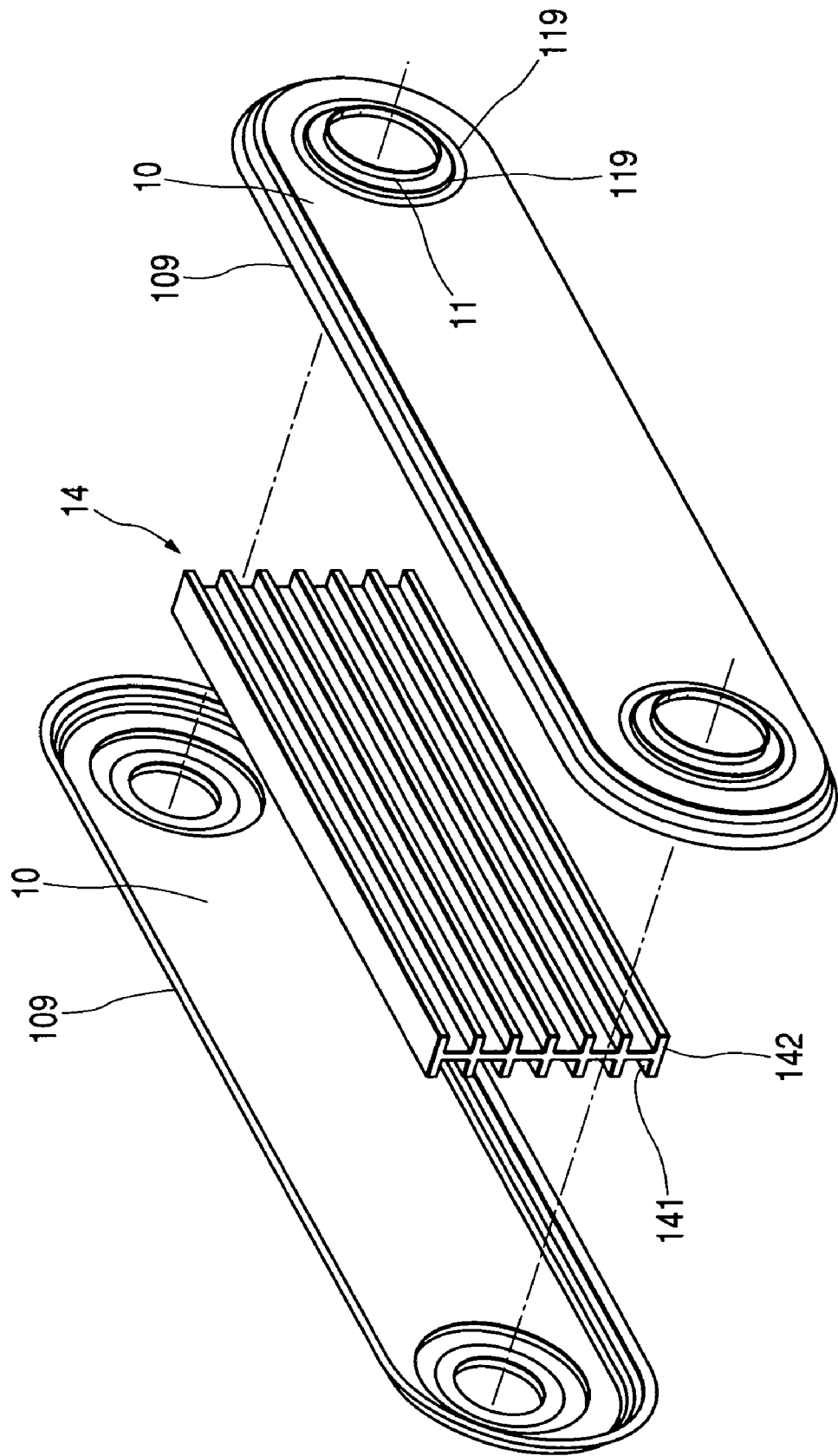
FIGS. 7, 8 and 9 show other variants of flat cooling tube holding a spacer of extruded metal plate.
Figure 8:
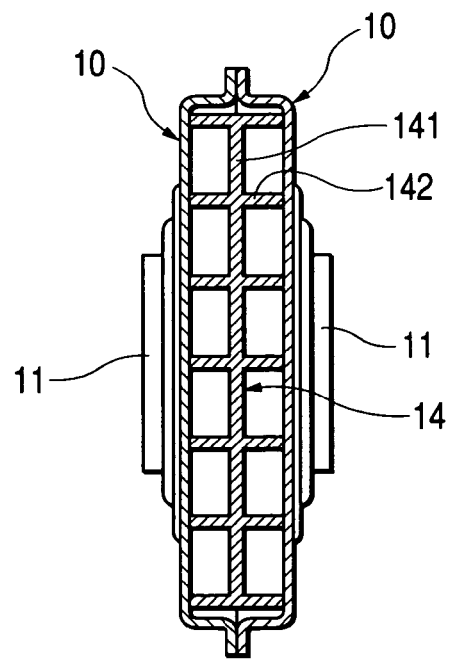
Figure 9:
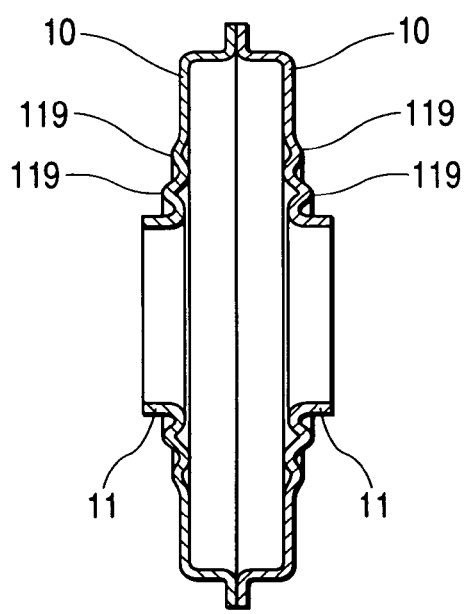

FIGS. 7, 8 and 9 shows yet another variant of flat cooling tube 2 of Embodiment 1. FIG. 7 is an exploded perspective view of the flat cooling tube 2. FIG. 8 is a cross sectional view of the flow channels of coolant. FIG. 9 is a cross sectional view of the connecting pipe portion 11. As shown in FIG. 7, the spacer 14 formed by extrusion is held between the press-formed metal plates 10 to form a flat cooling tube 2. A rib 109 is formed at the circumference of the metal plate 10 for joining two metal plates 10 face-to face. As shown in FIG. 8, the spacer 14 comprises: a central plate portion 141; and a plurality of ribs 142 projected toward the stacking direction and contacting the press-formed metal plates 10. Further, there is a coaxial circular corrugation 119 formed around the connecting pipe portion 11 as shown in FIGS. 7 and 9, thereby improving flexibility of the diaphragm.

Embodiment 2

Figure 10:
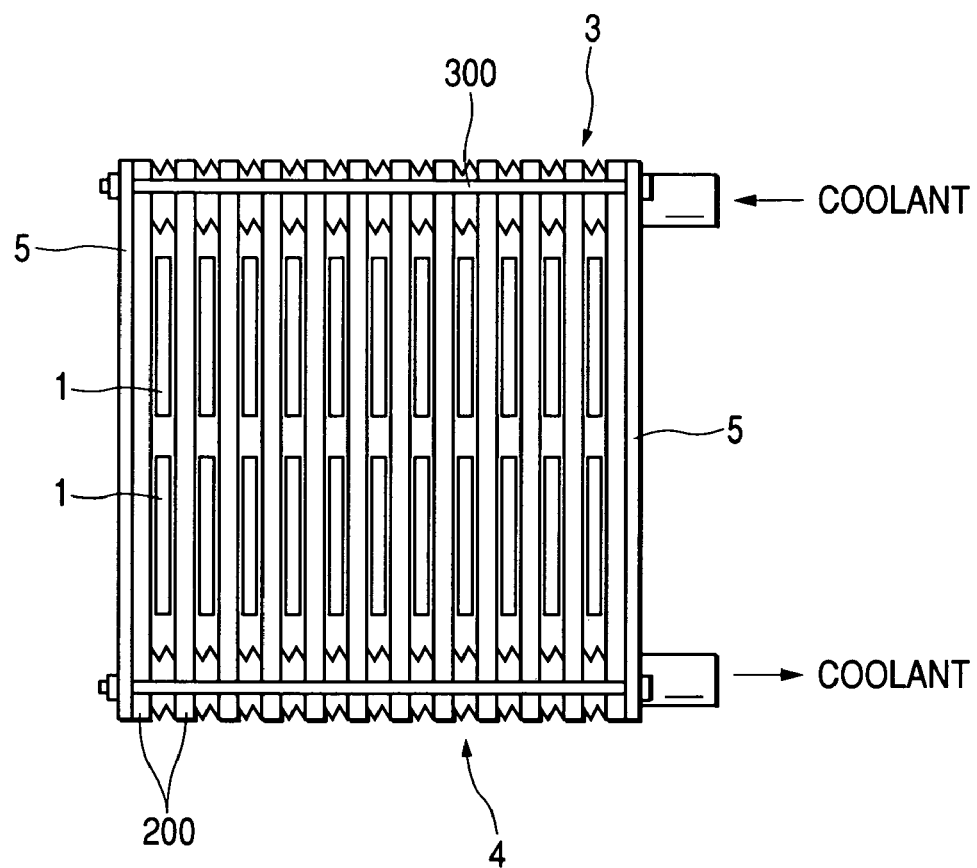
FIGS. 10, 11, 12 and 13 show a cooler provided with bellows for an inlet and outlet headers at right and left hand sides of Embodiment 2.
Figure 11:
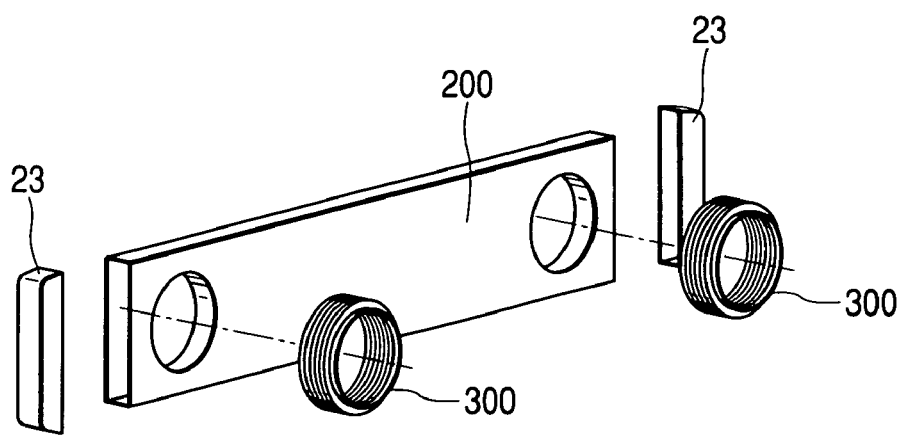

FIG. 10 is an elevational view of the cooler of Embodiment 2, while FIG. 11 is an exploded perspective view of the flat cooling tube 200 and a part of the inlet and outlet headers 3 and 4 of FIG. 10. The flat cooling tube 200 is an extruded metal plate, and caps 23 are brazed at both ends. Further, bellows 300 are brazed to holes bored at right and left hand ends of the flat cooling tube 200, thereby constructing the inlet and outlet headers 3 and 4. The bellows 300 is preferable because it is more flexible along the stacking direction than the diaphragm of Embodiment 1. Accordingly, the dimensional tolerances of the components are absorbed more easily than Embodiment 1, thereby enabling closer contact of the flat cooling tube 200 to the semiconductor module 1 and therefore, thereby transferring heat better from the semiconductor module 1 to the flat cooling tube 200, without applying excessively strong force on the semiconductor module.

Figure 12:
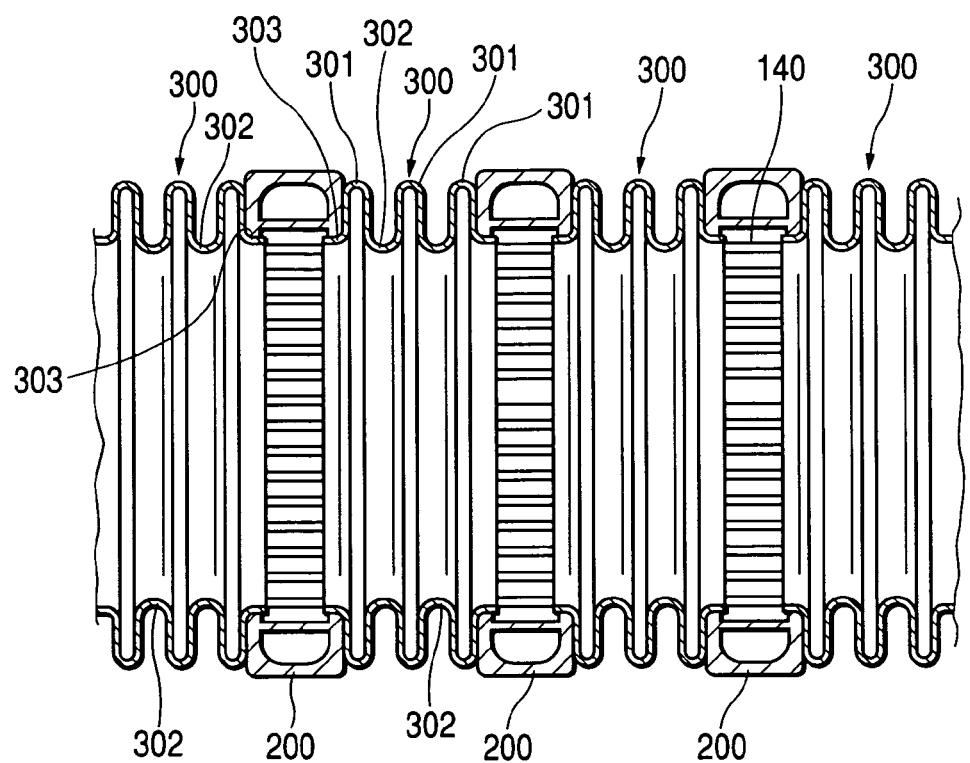

FIG. 12 is an enlarged view of the bellows 300 and flat cooling tubes 200. The semiconductor module 1 and through bolt 6 are not shown here. The bellows 300 comprises: three larger cylindrical portions 301 and two smaller cylindrical portions 302 alternately placed between each other; and two cylindrical end portions 303 which is projected from the larger cylindrical portions 301. The diameter of the cylindrical end portions 303 is the same as that of the small diameter cylinder 302. The cylindrical end portions 303 is fitted into a hole 201 of the flat cooling tube 200, whereby the outer surface of the larger cylindrical portions 301 closely contacts the outer surface of the flat cooling tube 200. Accordingly, the area of contact between the flat cooling tube 200 and the bellows 300 becomes sufficiently large, thereby securing the strength of brazing.

Figure 13:
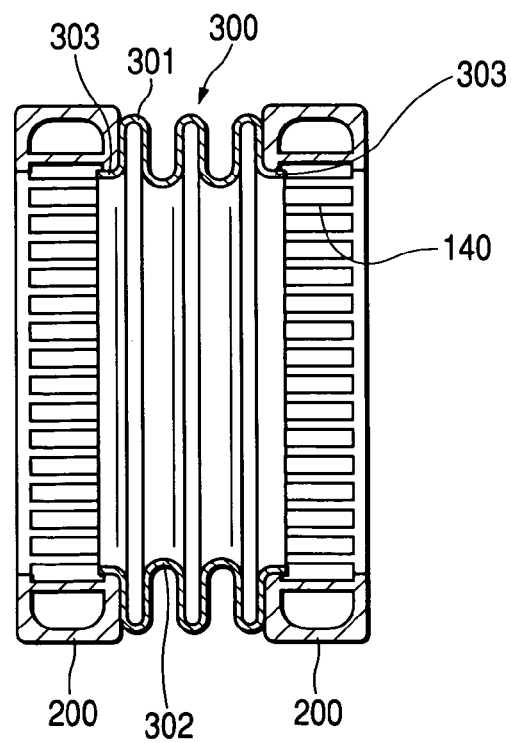

FIG. 13 shows a bellows 300 connecting two flat cooling tubes 200, wherein two flat cooling tubes 200 press one semiconductor device 1 (not-shown) there-between.

Embodiment 3

Figure 14:
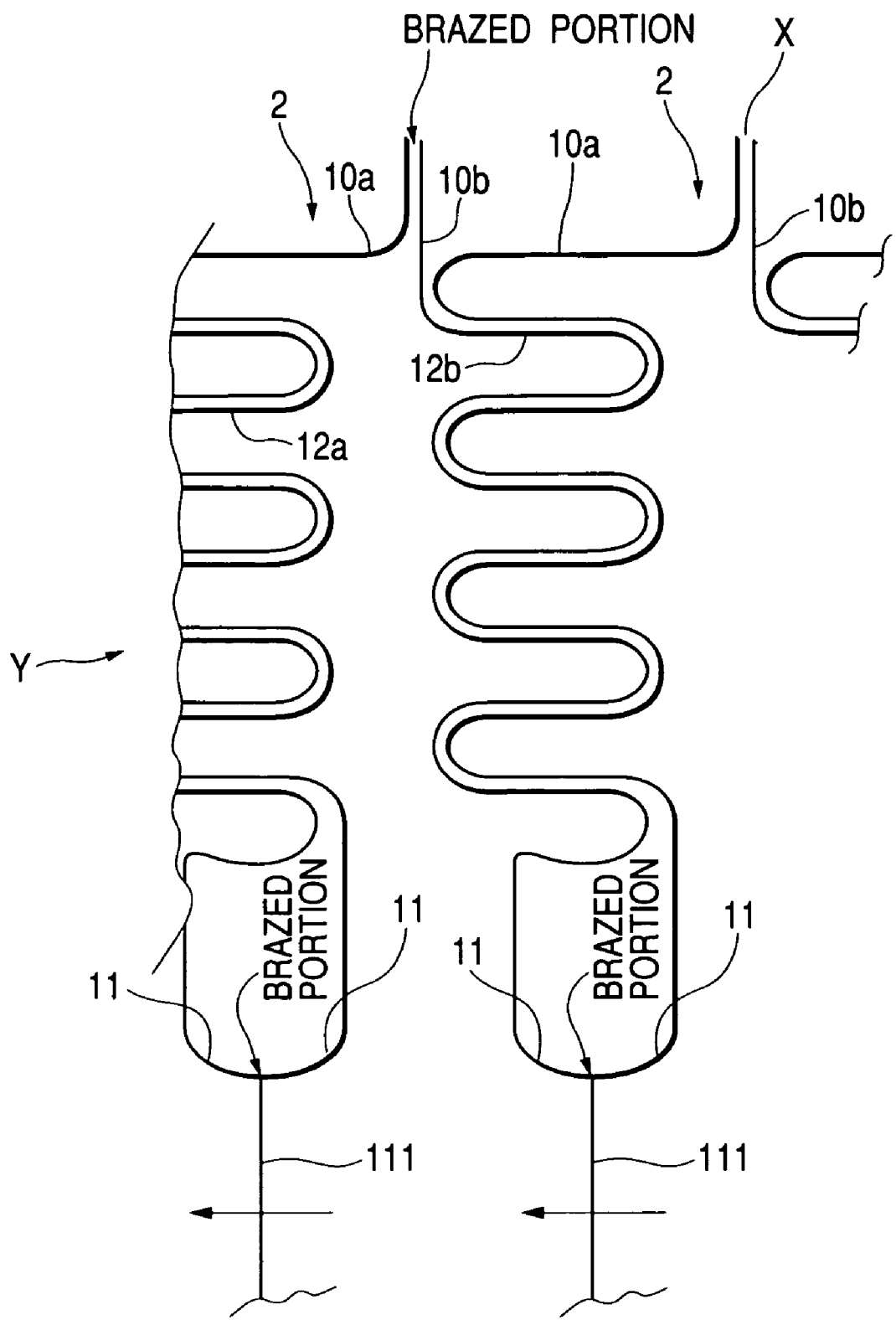
FIG. 14 is an enlarged cross sectional view near the inlet header of a cooler of Embodiment 3.

Another embodiment of this invention is explained below in reference to FIG. 14. FIG. 14 shows a variant of the embodiment previously shown in FIG. 1, enlarging a part proximate to the header 3 only. Here metal plates 10 in FIG. 1 of the embodiment 1 are, here in FIG. 14, shown as press-formed metal plates 10a and 10b, expressed simply as lines omitting their thicknesses.

The feature of this embodiment resides in that the metal plates 10a and 10b are formed in different shapes from each other. The metal plates 10a and 10b are joined, for example, by brazing similarly to the embodiment 1.

The metal plates 10a and 10b have holes 111 similarly to the metal plates 10 of the embodiment 1. The metal plate 10a has a diaphragm disk 12a around the connecting pipe portion 11, while the metal plate 10b has a diaphragm disk 12b correspondingly.

In this embodiment, each of the diaphragm disks 12a and 12b consists of four rings formed coaxially. The rings of the two diaphragm disks are conforming with each other and spaced apart by a small distance, thereby allowing the height of each ring of the diaphragm to be about the same as that of the semiconductor device 1, to improve the flexibility of the diaphragm disks and make their deformation easier. The diaphragm structure of this embodiment is readily applicable to the embodiment shown in FIG. 6.

What is claimed is:

1. A cooler for cooling both sides of one or more semiconductor devices, the cooler comprising:

a plurality of flat cooling tubes each disposed at each of both sides of each of said semiconductor devices to form a stack in which the semiconductor devices and the flat cooling tubes are stacked alternately on one another in a stacking direction, each flat cooling tube having both end portions located in a direction perpendicular to the stacking direction when the stack is formed;

an inlet header having a cooling channel through which a coolant is supplied and passed for cooling the semiconductor devices of the stack;

an outlet header having a further cooling channel through which the coolant is collected; and a pressing mechanism generating a pressing force to press the stack of said semiconductor devices and said flat cooling tubes, wherein each of the inlet and outlet headers includes an end portion extended from each of both ends of each flat cooling tube in the direction perpendicular to the stacking direction, the end portion having an opening portion in each flat cooling tube which is opened along the stacking direction and is connected in a liquid tight manner with an adjacent flat cooling tube and a diaphragm portion which is formed around the opening portion and is deformable under said pressing force along the stacking direction, wherein an end of the opening portion in a direction perpendicular to the stacking direction is connected in a liquid tight manner with another end of another opening portion of an adjacent flat cooling tube.

2. The cooler according to claim 1, wherein said flat cooling tube is made of two press-formed metal plates including a cup-shaped portion brazed face to face to form a tube.

3. The cooler according to claim 1, wherein said flat cooling tube is made of two press-formed metal plates of the same shape which are brazed face to face to form a tube.

* * * * *